(12) United States Patent
Heid

(10) Patent No.: US 6,853,192 B2
(45) Date of Patent: Feb. 8, 2005

(54) METHOD FOR DESIGNING A SELECTIVE RF PULSE FOR USE IN A MAGNETIC RESONANCE APPARATUS

(75) Inventor: Oliver Heid, Gunzenhausen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/439,694

(22) Filed: May 16, 2003

(65) Prior Publication Data

US 2003/0214298 A1 Nov. 20, 2003

(30) Foreign Application Priority Data

May 16, 2002 (DE) ......................................... 102 21 850

(51) Int. Cl.$^7$ .............................................. G01V 3/00
(52) U.S. Cl. ..................................................... 324/314
(58) Field of Search ................. 324/307, 309, 324/313–314

(56) References Cited

U.S. PATENT DOCUMENTS

| | | | | |
|---|---|---|---|---|
| 5,212,448 A | * | 5/1993 | Le Roux et al. ............ | 324/309 |
| 5,280,245 A | * | 1/1994 | Pauly ......................... | 324/307 |
| 5,499,629 A | * | 3/1996 | Kerr et al. .................. | 600/410 |
| 5,572,126 A | * | 11/1996 | Shinnar ...................... | 324/314 |
| 5,821,752 A | * | 10/1998 | LeRoux ....................... | 324/314 |
| 6,028,428 A | * | 2/2000 | Cunningham et al. ...... | 324/314 |
| 6,181,134 B1 | * | 1/2001 | Wald ........................... | 324/307 |
| 6,265,875 B1 | * | 7/2001 | Saranathan et al. ......... | 324/314 |
| 6,597,170 B1 | * | 7/2003 | Beard et al. ................ | 324/303 |

OTHER PUBLICATIONS

"Parameter Relations for the Shinnar–Le Roux Selective Excitation Pulse Design Algorithm," Pauly et al, IEEE Trans. On Medical Imaging, vol. 10, No. 1, Mar. 1991, pp. 53–65.

"On The Design of FIR Filters by Complex Chebyschev Approximation," Preuss, IEEE Trans. On Acoustics, Speech and Signal Processing, vol. 37, No. 5, May 1989, pp. 702–712.

* cited by examiner

*Primary Examiner*—Christopher W. Fulton
*Assistant Examiner*—Dixomara Vargas
(74) *Attorney, Agent, or Firm*—Schiff Hardin LLP

(57) ABSTRACT

In a method for designing a selective RF pulse for a magnetic resonance apparatus, based on a determination of a first polynomial ($A_n(z)$) and a second polynomial ($B_n(z)$) that are Shinnar-LeRoux transforms of the RF pulse, a flip angle distribution ($\alpha(x)$) to be achieved with the RF pulse is prescribed, the first polynomial ($A_n(z)$) is determined proceeding from the flip angle distribution ($\alpha(x)$), the phase distribution of the transverse magnetization to be achieved with the RF pulse is prescribed, and the second polynomial ($B_n(z)$) is determined such that the magnitude is determined by the flip angle distribution ($\alpha(x)$) and the phase thereof corresponds to a sum of the prescribed phase distribution and the phase of the, first polynomial ($A_n(z)$).

11 Claims, 1 Drawing Sheet

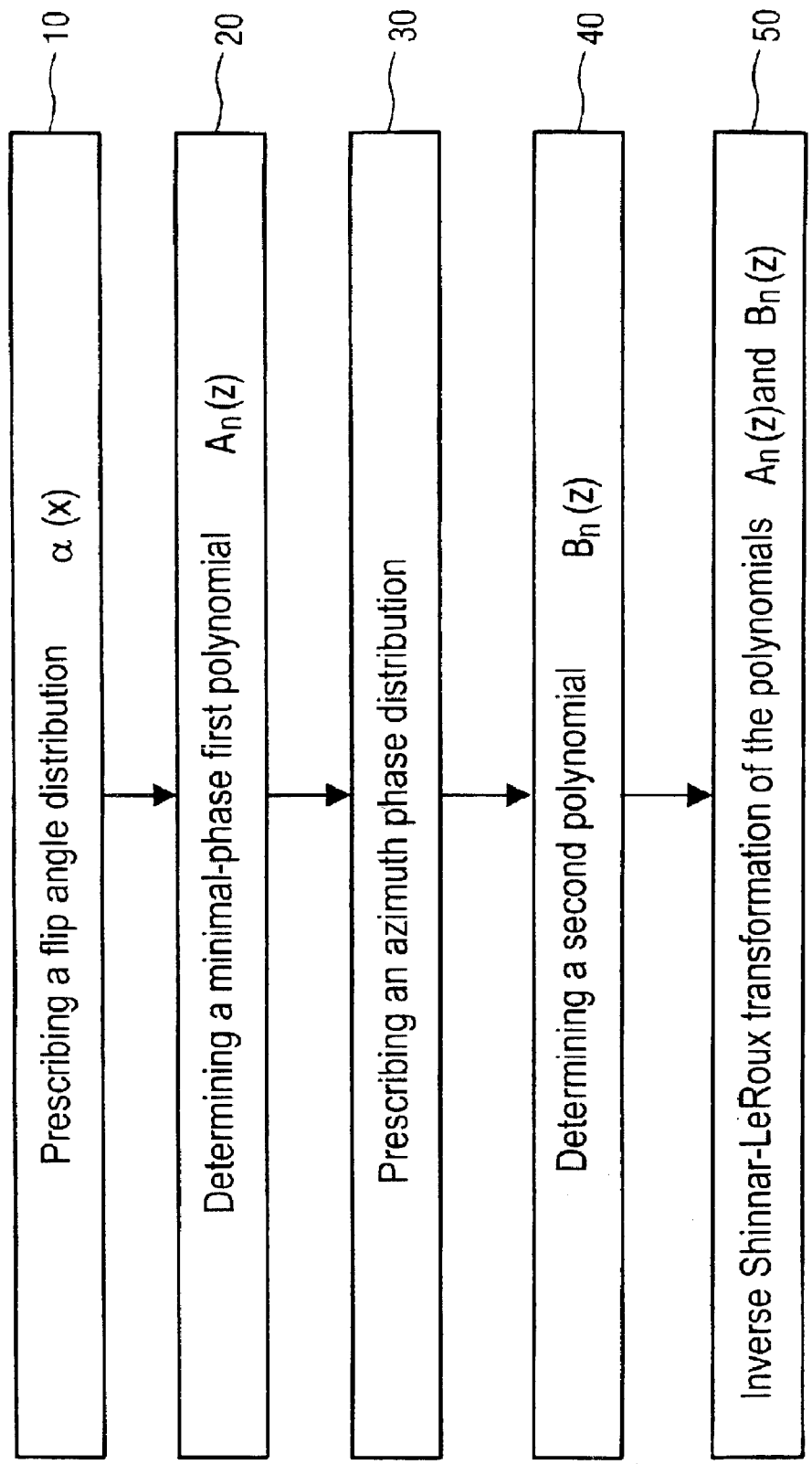

METHOD FOR DESIGNING A SELECTIVE RF PULSE FOR USE IN A MAGNETIC RESONANCE APPARATUS

BACKGROUND OF THE INVENTION

1. Field of the Invention

The present invention on is directed to a method for designing a selective RF pulse for use in a magnetic resonance apparatus, as well as to a selective RF pulse designed in accordance with the method.

2. Description of the Prior Art

Magnetic resonance is a known technology for, among other things, acquiring images of the inside of the body of an examination subject. In a magnetic resonance apparatus, rapidly switched gradient fields that are generated by a gradient coil system are thereby superimposed on a static basic magnetic field that is generated by a basic field magnet. The magnetic resonance apparatus also has a radiofrequency (RF) system that emits radiofrequency energy into the examination subject for triggering magnetic resonance signals and picks up the magnetic resonance signals, on the basis of which magnetic resonance images are produced.

When the examination subject is thereby exposed to the static, homogeneous basic magnetic field, those atomic nuclei of the examination subject having a magnetic moment have a resonant frequency that is directly proportional to the strength of the basic magnetic field. If the atomic nuclei of a prescribable isotope that is bonded in a prescribable chemical bond, for example $^1H$ in $H_2O$, were excited with an RF pulse having the same frequency as the atomic nuclei bonded in this way, then all of these atomic nuclei would exhibit identical resonance and emit undifferentiated magnetic resonance signals that would contain no spatial information as to the distribution of the atomic nuclei in the examination subject.

For a spatially specific magnetic resonance signal, one standard method is to superimpose a magnetic gradient field on the static basic magnetic field during the excitation with RF pulses. As a result, the atomic nuclei experience different magnetic field strengths at different locations along the gradient of the gradient field and therefore exhibit resonance at different frequencies. A slice without any thickness whatsoever would be excited with a "monochromatic" RF pulse would have only one of the resonant frequencies. A thin, three-dimensional cuboid, however, is desired as a slice, so that the exciting RF pulse must have a specific bandwidth of neighboring frequencies around its center frequency so that it can excite the desired, narrow spatial region of the slice thickness along the gradient.

Due to non-linearities of Bloch's equations, the design problem for selective RF pulses generally also is not of a linear nature. One possible solution of this problem thereby makes use of an algorithm known as the Shinnar-LeRoux algorithm that is described in greater detail in the article by J. Pauly at el., "parameter Relations for the Shinnar-LeRoux Selective Excitation Pulse Design Algorithm", IEEE Transactions on Medical Imaging, Vol. 10, No.1. March 1991, pages 56 through 65. In accord therewith, there is a definitive relationship between an RF pulse $B_1(t)$ and two polynomials $A_n(z)$ and $B_n(z)$ via the Shinnar-LeRoux transformation:

$$B_1(t) \xrightarrow{\text{Shinnar-LeRoux}} (A_n(z), B_n(z))$$

with t representing time and z being a complex variable. A solution of the design problem for a selective RF pulse proceeds from the fact that the polynomial $B_n(e^{i\gamma Gx\Delta t})$ is proportional to the sine of half the flip angle at the location x, i.e. to $\sin(\alpha(x)/2)$, given a flip angle distribution $\alpha(x)$ that is prescribed for a selection gradient direction. The definition of the complex variable z as $z=e^{i\gamma G\Delta t}$ effects a presentation of the polynomial $B_n(z)$ on the circle with radius 1, whereby $\gamma$ is the gyromagnetic ratio, G is the selection gradient amplitude and $\Delta t$ is the duration of a section of the imagined RF pulse divided into many constant sections. First, that polynomial $B_n(z)$ that optimally approaches the ideal slice profile is determined, making use, for example, of the Parks-McClellan algorithm. Subsequently, $A_n(z)$ is determined in agreement with $B_n(z)$ with the additional condition that the resulting RF pulse has minimum energy, to which end the polynomial $A_n(z)$ is selected with phase minimization and determined from $B_n(z)$ via the Hilbert transformation. After $A_n(z)$ and $Bn(z)$ have been determined, the RF pulse is determined by means of the inverse Shinnar-LeRoux transformation.

Further, the polynomials $A_n(z)$ and $B_n(z)$ are linked to one another via the equation $A_n(z) \cdot A_n \cdot X(z) + B_n(z) \cdot B_n \cdot X(z) = 1$, resulting in the magnitude $|A_n(z)|$ of the polynomial $A_n(z)$ for $\cos(\alpha(x)/2)$ and the phase thereof being derived as an unambiguous function of $|A_n(z)|$, and thus of $|B_n(z)|$ as a consequence of the aforementioned phase minimization. Given excitation of a steady state magnetization with an RF pulse designed in this way, the transverse magnetization then corresponds to twice the convolution product of the two polynomials $A_n(z)$ [sic] and $B_n(z)$. As is known, the magnitude of the convolution product is $2 \sin(\alpha(x)/2)\cos(\alpha(x)/2)=\sin(\alpha(x))$. The phase distribution of the transverse magnetization along the selection gradient direction x—referred to in short as the azimuth phase distribution—thereby arises from the phase sum of $A_n \cdot X(z)$ and $B_n(z)$, i.e. from the phase difference of $A_n(z)$ and $B_n(z)$.

SUMMARY OF THE INVENTION

An object of the invention is to provide a method for designing a selective RF pulse such that the azimuth phase distribution can be prescribably set with the RF pulse, as well as to provide such an RF pulse itself.

This object is achieved in accordance with the invention in a method for designing a selective RF pulse for a magnetic resonance apparatus, based on a determination of a first polynomial and a second polynomial that are Shinnar-LeRoux transforms of the RF pulse, wherein a flip angle distribution to be achieved with the RF pulse is prescribed, the first polynomial is determined proceeding from the flip angle distribution, the phase distribution of the transverse magnetization to be achieved with the RF pulse is prescribed, and the second polynomial is determined such that the magnitude thereof is determined by the flip angle distribution and the phase thereof corresponds to a sum of the prescribed phase distribution and the phase of the first polynomial. The object also is achieved by a selective RF pulse designed in this manner.

For example, the spin magnetization can be advantageously set such that it is just re-phased by a prescribable gradient-time integral, or the azimuth phase distribution can be set with a quadratic curve in order, for example, to reduce the dynamic range of the magnetic resonance signals to be acquired via the phaseencoding steps. This allows an analog-to-digital converter with a correspondingly reduced dynamic range to be used for converting the magnetic resonance signals or to receive magnetic resonance signals given the presence of inhomogeneities of a basic magnetic field. This is referred to as a non-dephasable RF pulse.

In the known methods based on the Shinnar-LeRoux algorithm, by contrast, the azimuth phase distribution cannot be freely prescribed. Since the known methods use a polynomial that is either symmetrical or phase-minimized as the second polynomial, the azimuth phase distribution that is achieved is also rigidly prescribed by the phase of the second polynomial and by the minimum phase of the first polynomial.

The inventive method thus has a common feature with the known methods based on the Shinnar-LeRoux algorithm of exactly inverting the discrete Bloch equation, i.e. the Bloch equations described in terms of supporting points for the RF pulse. In contrast to the known methods, however, the inventive method also enables the azimuth phase distribution of a spin distribution to be prescribably set in addition to an amplitude distribution.

DESCRIPTION OF THE DRAWINGS

The single FIGURE is a flow chart of a method for designing a selective RF pulse in accordance with the invention.

DESCRIPTION OF THE PREFERRED EMBODIMENTS

As an exemplary embodiment of the invention, the figure illustrates a flowchart for a method for designing a selective RF pulse for a magnetic resonance apparatus, based on a determination of a first polynomial $A_n(z)$ and of a second polynomial $B_n(z)$ that are Shinnar-LeRoux transforms of the RF pulse. The definition of the complex variable z as $z=e^{i\gamma Gx \Delta t}$ effects a presentation of the polynomial $B_n(z)$ on a circle with radius 1, wherein γ is the gyromagnetic ratio, G is the selection gradient amplitude and Δt is the duration of a section of the imagined RF pulse divided into many constant sections. In order to obtain an RF pulse design method that allows setting of a freely prescribable azimuth phase distribution in the context of Shannon's sampling theorem, a flip angle distribution α(x) is first prescribed in the desired way via the selection gradient direction x in a first step 10. As described above, the magnitude of the second polynomial $|B_n(e^{i\gamma Gx\Delta t})|$ is equal to the sine of half the flip angle distribution α(x), i.e. to sin(α(x)/2).

In a second step 20, the first polynomial $A_n(e^{i\gamma Gx\Delta t})$ is determined with a minimized phase by means of the Hilbert transformation proceeding from $|B_n(e^{i\gamma Gx\Delta t})|=\sin(\alpha(x)/2)$. No knowledge whatsoever of the phase of the second polynomial $B_n(e^{i\gamma Gx\Delta t})$ is required for the steps 10 and 20.

In a third step 30, a desired azimuth phase distribution to be achieved with the RF pulse is then prescribed. The phase of the second polynomial $B_n(e^{i\gamma Gx\Delta t})$ is derived as the sum of this azimuth phase distribution and the phase of the first polynomial $A_n(e^{i\gamma Gx\Delta t})$. The phase of the polynomial $B_n(e^{i\gamma Gx\Delta t})$ has thus been determined.

The second polynomial $B_n(e^{i\gamma Gx\Delta t})$ of the degree n is determined in a fourth step 40 by means of an approximation, i.e. by means of a fit to the phase indicated in step 30 and to the magnitude determined in step 10 that is equal to the sine of half the flip angle distribution α(x). The second polynomial $B_n(e^{i\gamma Gx\Delta t})$ is determined, for example as a minimax polynomial with the minimum-maximum error magnitude, with a complex-value approximation. For example, the complex chebyshev aproximation described in the article by K. Preuss, "On the Design of FIR Filters by Complex Chebyshev Approximation", IEEE Transactions on Acoustics, Speech and Signal Processing, Vol. 37, No. 5, May 1989, pages 702 through 712, can be employed. The initially described algorithm of Parks-McClellan cannot be utilized since this only supplies linear-phase polynomials.

In a fifth step 50 the RF pulse is calculated by means of inverse Shinnar-LeRoux transformation from the polynomials $A_n(e^{i\gamma Gx\Delta t})$ and $B_n(e^{i\gamma Gx\Delta t})$ determined in the preceding steps 20 and 40. In another embodiment, the first polynomial $A_n(e^{i\gamma Gx\Delta t})$ is re-determined again before the calculation of the RF pulse proceeding from the second polynomial $B_n(e^{i\gamma Gx\Delta t})$ determined in the step 40, and these polynomials are then subjected to the inverse Shinnar-LeRoux transformation.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for designing a selective RF pulse for a magnetic resonance apparatus, comprising the steps of:

prescribing a flip angle distribution to be produced by an RF pulse;

determining a first polynomial dependent on said flip angle distribution;

prescribing a phase distribution of a transverse magnetization to be produced by said RF pulse;

determining a second polynomial, said second polynomial and said first polynomial being Shinnar-LeRoux transforms of said RF pulse, with a magnitude determined by said flip angle distribution and a phase corresponding to a sum of the prescribed phase distribution and a phase of said first polynomial; and calculating said RF pulse from said first and second polynomials.

2. A method as claimed in claim 1 comprising the additional step of employing a selection gradient having a selection gradient direction in said magnetic resonance apparatus in combination with said RF pulse, and wherein the step of prescribing said flip angle distribution comprises prescribing said flip angle distribution along said selection gradient direction.

3. A method as claimed in claim 1 comprising determining said first polynomial with minimization of the phase of said first polynomial.

4. A method as claimed in claim 1 comprising determining said first polynomial using a Hilbert transformation.

5. A method as claimed in claim 1 comprising determining said first polynomial from a magnitude of said second polynomial equal to a sine of half of said flip angle distribution.

6. A method as claimed in claim 1 comprising the additional step of employing a selection gradient having a selection gradient direction in said magnetic resonance apparatus in combination with said RF pulse, and wherein the step of prescribing said phase distribution comprises prescribing said phase distribution along said selection gradient direction.

7. A method as claimed in claim 1 comprising determining said second polynomial by complex value approximation.

8. A method as claimed in claim 7 wherein said complex value approximation has an error function associated therewith, and comprising the additional step of minimizing said error function in said complex value approximation.

9. A method as claimed in claim 7 comprising employing a complex Chebyshev approximation as said complex value approximation.

10. A method as claimed in claim 1 comprising determining a further first polynomial from said second polynomial.

11. A method as claimed in claim 1 wherein the step of calculating said selective RF pulse comprises calculating said selective RF pulse as inverse Shinnar-LeRoux transform of said first and second polynomials.

* * * * *